US008149021B2

(12) United States Patent
Mikami et al.

(10) Patent No.: US 8,149,021 B2
(45) Date of Patent: Apr. 3, 2012

(54) CURRENT DETECTION CIRCUIT AND VOLTAGE CONVERTER USING THE CURRENT DETECTION CIRCUIT

(75) Inventors: Kouichi Mikami, Kanagawa (JP); Takuya Ishii, Osaka (JP); Takashi Ryu, Kyoto (JP)

(73) Assignee: Panasonic Corporation, Osaka (JP)

( * ) Notice: Subject to any disclaimer, the term of this patent is extended or adjusted under 35 U.S.C. 154(b) by 325 days.

(21) Appl. No.: 12/643,292

(22) Filed: Dec. 21, 2009

(65) Prior Publication Data

US 2010/0156383 A1 Jun. 24, 2010

(30) Foreign Application Priority Data

Dec. 22, 2008 (JP) ................................. 2008-325570

(51) Int. Cl.
*H02M 11/00* (2006.01)
(52) U.S. Cl. ........................................ 327/103; 327/100
(58) Field of Classification Search .................. 327/103, 327/100, 538, 541
See application file for complete search history.

(56) References Cited

U.S. PATENT DOCUMENTS

| 4,885,477 | A | 12/1989 | Bird et al. | |
|---|---|---|---|---|
| 5,081,379 | A | 1/1992 | Korteling | |
| 5,220,207 | A | 6/1993 | Kovalcik et al. | |
| 6,522,175 | B2 * | 2/2003 | Ueno et al. | 327/103 |
| 6,552,889 | B1 | 4/2003 | Huang et al. | |
| 7,710,165 | B2 * | 5/2010 | Bi | 327/103 |
| 2002/0158654 | A1 | 10/2002 | Graf | |
| 2004/0227539 | A1 | 11/2004 | Thiery | |
| 2006/0028192 | A1 | 2/2006 | Ryu et al. | |

* cited by examiner

*Primary Examiner* — Hai L Nguyen
(74) *Attorney, Agent, or Firm* — RatnerPrestia

(57) ABSTRACT

A first auxiliary switch circuit is connected to one terminal and a first terminal of a main switch circuit and generates a first auxiliary detection current. A second auxiliary switch circuit is connected to the other terminal and a second terminal of the main switch circuit and generates a second auxiliary detection current. A current adjustment detection circuit adjusts the first auxiliary detection current so that the potentials of the other terminal and the first terminal are equal and passes the first auxiliary detection current in a direction of receiving the current from the first auxiliary switch circuit and adjusts the second auxiliary detection current so that the potentials of the one terminal and the second terminal are equal and passes the second auxiliary detection current in a direction of outputting the current to the second auxiliary switch circuit, thereby generating a detection current being proportional to the output current.

22 Claims, 4 Drawing Sheets

CURRENT DETECTION CIRCUIT AND VOLTAGE CONVERTER USING THE CURRENT DETECTION CIRCUIT

BACKGROUND OF THE INVENTION

1. Field of Invention

The present invention relates to a current detection circuit and a voltage converter using the current detection circuit, more particularly, to a circuit for use in mobile appliances and for detecting the output current of a power source circuit formed of a semiconductor integrated circuit.

2. Description of Related Art

In recent years, a power source circuit for use in various kinds of electronic appliances and for supplying stable DC power to a load is provided with a current detection circuit for mainly detecting the output current of the power source circuit.

For example, U.S. Pat. No. 4,885,477 discloses such a current detection circuit as shown in FIG. 4. In FIG. 4, an output current Iop is supplied from an input terminal InP through a main transistor $1p$ formed of an N-channel MOS transistor to a load 2P and an output terminal Outp, and a current proportional to the output current Iop flows to a control circuit $8p$. Like the main transistor Ip, an auxiliary transistor $3p$ is formed of an N-channel MOS transistor. The drain terminal of the auxiliary transistor $3p$ is connected to the input terminal Inp and the gate terminal of the auxiliary transistor $3p$ is connected to a terminal VgP, as in the main transistor $1p$. An adjustment circuit $4p$ is formed of an amplifier $40p$ and a P-channel MOS transistor $41p$. The non-inverting input terminal of the amplifier $40p$ is connected to the source terminal of the main transistor $1p$ and the inverting input terminal of the amplifier $40p$ is connected to the source terminal of the auxiliary transistor $3p$. The output of the amplifier $40p$ is connected to the gate terminal of the transistor $41p$. The source terminal of the transistor $41p$ is connected to the source terminal of the auxiliary transistor $3p$, and the drain terminal of the transistor $41p$ is used to output a detection current Isp to the control circuit $8p$.

With the above-mentioned configuration, the main transistor $1p$ supplies the output current Iop from the input terminal Inp to the load $2p$ through the output terminal Outp on the basis of the voltage applied to the terminal Vgp. Simultaneously, the auxiliary transistor $3p$ supplies the detection current Isp to the control circuit $8p$ through the transistor $41p$ on the basis of the voltage applied to the same terminal Vgp as that described above. At this time, the amplifier $40p$ performs feedback operation in which the gate terminal of the transistor $41p$ is controlled to adjust the impedance of the transistor $41p$ so that the source potential of the main transistor $1p$ becomes equal to the source potential of the auxiliary transistor $3p$. With this feedback operation, the terminal potentials of the main transistor $1p$ become equal to the terminal potentials of the auxiliary transistor $3p$ with one another. The ratio of the drain-source resistance (ON resistance) of the auxiliary transistor $3p$ to that of the main transistor $1p$ is accurately inversely proportional to the ratio of the size of the auxiliary transistor $3p$ to that of the main transistor $1p$. The ratio of the current flowing through the auxiliary transistor $3p$ to that flowing through the main transistor $1p$ is proportional to the ratio of the size of the auxiliary transistor $3p$ to that of the main transistor $1p$. In other words, in the case that the size of the main transistor $1p$ is N times the size of the auxiliary transistor $3p$, the detection current Isp flowing through the control circuit 8 is 1/N times the output current Iop (Isp=Iop/N).

SUMMARY OF THE INVENTION

However, in the above-mentioned conventional example, in the case that the voltage of the output terminal Outp lowers, feedback operation occurs so that the potential of the inverting input terminal of the amplifier $40p$ also lowers. The voltage of the output terminal Outp lowers when the output current Iop of the output terminal Outp becomes excessive or when the output terminal Outp is short-circuited to the ground. As a result, the source potential of the transistor $41p$ lowers, and it becomes difficult to securely obtain an operating voltage between the drain and source terminals of the transistor $41p$. For this reason, there is a problem that the output current Iop cannot be detected accurately using the detection current Isp flowing to the control circuit $8p$.

For the purpose of solving the problem encountered in the above-mentioned conventional example, an object of the present invention is to provide a current detection circuit for accurately detecting an output current even if the voltage at an output terminal lowers and for supplying a detection current to a control circuit, and to provide a voltage converter using the current detection circuit.

In order to attain the above-mentioned object, the current detection circuit according to the present invention comprises a main switch circuit capable of passing an output current received from a power source circuit to a load; a first auxiliary switch circuit connected to one terminal of the main switch circuit and a first terminal, and generating a first auxiliary detection current being smaller than the output current and approximately proportional to the output current when turned ON; a second auxiliary switch circuit connected to the other terminal of the main switch circuit and a second terminal, and generating a second auxiliary detection current being smaller than the output current and approximately proportional to the output current when turned ON; and a current adjustment detection circuit, wherein the current adjustment detection circuit includes a first adjustment circuit, a second adjustment circuit and a detection current generating circuit; the first adjustment circuit adjusts the first auxiliary detection current so that the other terminal and the first terminal have the same potential and passes the adjusted first auxiliary detection current in a direction of receiving the current from the first auxiliary switch circuit; the second adjustment circuit adjusts the second auxiliary detection current so that the one terminal and the second terminal have the same potential and passes the adjusted second auxiliary detection current in a direction of outputting the current to the adjusted second auxiliary switch circuit; and the detection current generating circuit generates a detection current being smaller than the output current and approximately proportional to the output current on the basis of the adjusted first detection current and the adjusted second detection current.

The voltage converter according to the present invention has a voltage conversion circuit capable of raising or lowering a DC power source voltage supplied from a DC power source and capable of generating an output current and the above-mentioned current detection circuit, wherein the voltage conversion circuit is included in the power source circuit.

With the current detection circuit according to the present invention, the first adjustment circuit is configured to pass the first auxiliary detection current in a direction of receiving the current from the first auxiliary switch circuit, and the second adjustment circuit is configured to pass the second auxiliary detection current in a direction of outputting the current to the second auxiliary switch circuit. The first auxiliary detection current and the second auxiliary detection current flow in one direction, that is, from a power source potential to a ground potential or from the ground potential to the power source potential. Furthermore, the potentials of the power source side terminals of the main switch circuit, the first auxiliary switch circuit and the second auxiliary switch circuit are approximately equal to one another, and the potentials of the ground side terminals thereof are approximately equal to one another. Hence, the respective potentials of the first adjustment circuit and the second adjustment circuit are separated between two sides of potentials different to each other, that is, the side of the power source potential and the side of the ground potential, while the potential across both terminals of the main switch circuit is used as a boundary. Consequently, even in a state in which the voltage across both terminals of the load lowers and the difference between the potential of the ground side terminal of the main switch circuit and the ground potential lowers, either one of the first adjustment circuit and the second adjustment circuit can securely obtain a sufficient operating voltage, whereby the output current can be detected accurately.

DETAILED DESCRIPTION OF THE PREFERRED EMBODIMENTS

Figure 1:
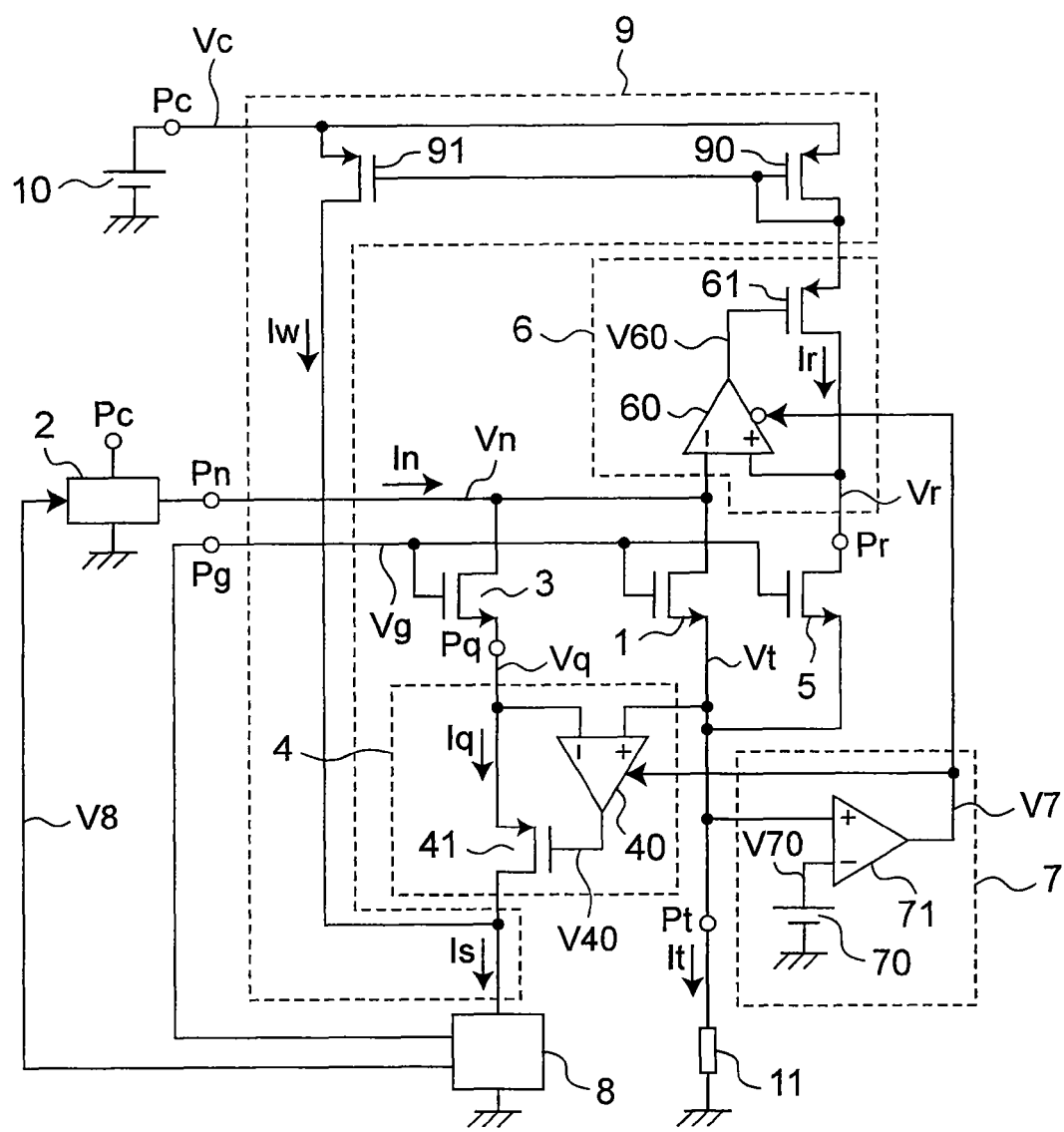
FIG. 1 is a circuit diagram showing the configuration of a current detection circuit and a voltage converter using the current detection circuit according to a first embodiment of the present invention.

Some examples of the best modes for embodying the present invention will be described below referring to the accompanying drawings. In the drawings, components having substantially the same configurations, operations and effects are designated by the same reference codes. Both a voltage and a potential may be represented using one code referring to one point on a circuit wiring. In this case, the voltage represents the difference between this potential and the ground potential, for example. In addition, numbers described below are all exemplified to specifically explain the present invention, and the present invention is not limited by the exemplified numbers. Furthermore, the logic levels represented by high/low levels or the switching states represented by ON/OFF states are used to specifically exemplify the present invention, and similar results can also be obtained by variously combining exemplified logic levels or switching states. Moreover, connections between the components are exemplified to specifically explain the present invention, and connections for achieving the functions of the present invention are not limited to these connections. Still further, although embodiments described below are configured using hardware and/or software, a configuration implemented by hardware can also be implemented by software, and a configuration implemented by software can also be implemented by hardware.

First Embodiment

FIG. 1 is a circuit diagram showing the configuration of a current detection circuit and a voltage converter using the current detection circuit according to a first embodiment. In FIG. 1, the current detection circuit includes a main switch circuit 1, an auxiliary switch circuit 3, an auxiliary switch circuit 5, an adjustment circuit 4, an adjustment circuit 6, a detection current generating circuit 9, and a selection circuit 7. The voltage converter includes the above-mentioned current detection circuit, a control circuit 8, a DC power source 10, a voltage conversion circuit 2, and a load 11. The main switch circuit 1 and the auxiliary switch circuits 3 and 5 are each formed of an NMOS transistor. The adjustment circuit 4 includes an amplifier 40 and a PMOS transistor 41. The adjustment circuit 6 includes an amplifier 60 and a PMOS transistor 61. The detection current generating circuit 9 includes a PMOS transistor 90 and a PMOS transistor 91. The selection circuit 7 includes a reference voltage source 70 and a comparator 71.

The adjustment circuits 4 and 6 and the detection current generating circuit 9 constitute a current adjustment detection circuit. Each of the PMOS transistors 41 and 61 is an example of an adjuster. The PMOS transistors 90 and 91 constitute a current mirror circuit. The DC power source 10 and the voltage conversion circuit 2 constitute a power source circuit. The NMOS transistor is also referred to as an N-channel MOS (negative-channel metal oxide semiconductor) transistor. The PMOS transistor is also referred to as a P-channel MOS (positive-channel metal oxide semiconductor) transistor.

The power source terminal of the voltage conversion circuit 2 is connected to the positive electrode of the DC power source 10 via a terminal Pc, and the negative electrode of the DC power source 10 is grounded. The drain terminal of the main switch circuit 1 is connected to the output terminal of the voltage conversion circuit 2 via a terminal Pn, the source terminal of the main switch circuit 1 is connected to one terminal of the load 11 via an output terminal Pt, and the other terminal of the load 11 is grounded. The drain terminal of the auxiliary switch circuit 3 is connected to the terminal Pn, and the source terminal of the auxiliary switch circuit 3 is connected to the adjustment circuit 4 via a terminal Pq. The drain terminal of the auxiliary switch circuit 5 is connected to the adjustment circuit 6 via a terminal Pr, and the source terminal of the auxiliary switch circuit 5 is connected to the output terminal Pt.

In the adjustment circuit 4, the non-inverting input terminal of the amplifier 40 is connected to the output terminal Pt, the inverting input terminal of the amplifier 40 is connected to the terminal Pq, and the output terminal of the amplifier 40 is connected to the gate terminal of the PMOS transistor 41. The source terminal of the PMOS transistor 41 is connected to the terminal Pq, and the drain terminal of the PMOS transistor 41 serves as a terminal of the adjustment circuit 4 and connected to the detection current generating circuit 9. In the adjustment circuit 6, the inverting input terminal of the amplifier 60 is connected to the terminal Pn, the non-inverting input terminal of the amplifier 60 is connected to the terminal Pr, and the output terminal of the amplifier 60 is connected to the gate terminal of the PMOS transistor 61. The drain terminal of the PMOS transistor 61 is connected to the terminal Pr, and the source terminal of the PMOS transistor 61 serving as a terminal of the adjustment circuit 6 is connected to the detection current generating circuit 9.

In the detection current generating circuit 9, the drain terminal of the PMOS transistor 90 included in the current mirror circuit is connected to the source terminal of the PMOS transistor 61, and the drain terminal of the PMOS transistor 91 also included in the current mirror circuit is connected to the drain terminal of the PMOS transistor 41 and to the control circuit 8. The source terminals of the PMOS transistors 90 and 91 are connected to the terminal Pc. In the selection circuit 7, the non-inverting input terminal of the comparator 71 is connected to the output terminal Pt, the inverting input terminal of the comparator 71 is connected to the positive electrode of the reference voltage source 70, and the negative electrode of the reference voltage source 70 is grounded. The output terminal of the comparator 71 is connected to the enable terminal of the amplifier 40 and to the disenable terminal of the amplifier 60.

The DC power source 10 generates a positive DC power source voltage Vc. The voltage conversion circuit 2 raises or lowers the DC power source voltage Vc and generates an output voltage Vn and an output current In. When turned ON, the main switch circuit 1 passes an output current It approximately equal to the output current In to the load 11.

When turned ON, the auxiliary switch circuit 3 shunts part of the output current In and generates an auxiliary detection current Iq. The adjustment circuit 4 adjusts the auxiliary detection current Iq using negative feedback operation so that an output potential Vt at the output terminal Pt becomes equal to a potential Vq at the terminal Pq. More specifically, the amplifier 40 generates an amplified signal V40 that changes linearly with respect to the difference between the output potential Vt and the potential Vq. Controlled by the amplified signal V40, the PMOS transistor 41 adjusts the auxiliary detection current Iq flowing from the auxiliary switch circuit 3 so that the difference between the output potential Vt and the potential Vq is approximately zero. In the case that the potential Vq is higher than the output potential Vt, the potential of the amplified signal V40 lowers, and the PMOS transistor 41 increases the auxiliary detection current Iq. As a result, the potential Vq lowers. In the case that the potential Vq is lower than the output potential Vt, the potential of the amplified signal V40 rises, and the PMOS transistor 41 decreases the auxiliary detection current Iq. As a result, the potential Vq rises.

When turned ON, the auxiliary switch circuit 5 shunts part of the output current It and generates an auxiliary detection current Ir. The adjustment circuit 6 adjusts the auxiliary detection current Ir using negative feedback operation so that the potential Vn at the terminal Pn becomes equal to a potential Vr at the terminal Pr. More specifically, the amplifier 60 generates an amplified signal V60 that changes linearly with respect to the difference between the potential Vn and the potential Vr. Controlled by the amplified signal V60, the PMOS transistor 61 adjusts the auxiliary detection current Ir flowing to the auxiliary switch circuit 5 so that the difference between the potential Vn and the potential Vr is approximately zero. In the case that the potential Vr is lower than the potential Vn, the potential of the amplified signal V60 lowers, and the PMOS transistor 61 increases the auxiliary detection current Ir. As a result, the potential Vr rises. In the case that the potential Vr is higher than the potential Vn, the potential of the amplified signal V60 rises, and the PMOS transistor 61 decreases the auxiliary detection current Ir. As a result, the potential Vr lowers.

The current mirror circuit generates a current mirror current Iw that is approximately equal to the auxiliary detection current Ir. The detection current generating circuit 9 generates a detection current Is representing the sum of the current mirror current Iw and the auxiliary detection current Iq.

The control circuit 8 generates a control voltage V8 on the basis of the detection current Is. A switching transistor inside the voltage conversion circuit 2 is turned ON/OFF on the basis of the control voltage V8, whereby the voltage conversion circuit 2 raises or lowers the DC voltage Vc and generates the output current In. Instead of the control voltage V8, multiple control voltages may also be used depending on the number of switching transistors to be controlled. Furthermore, the control circuit 8 generates a control voltage Vg on the basis of the detection current Is and applies the control voltage Vg to the gate terminals of the main switch circuit 1 and the auxiliary switch circuits 3 and 5 via a control terminal Pg. The main switch circuit 1 and the auxiliary switch circuits 3 and 5 are turned ON/OFF simultaneously on the basis of the control voltage Vg. During voltage-lowering operation, the main switch circuit 1 and the auxiliary switch circuits 3 and 5 are turned ON at all times, and during voltage-raising operation, the switches are turned ON at the time of discharge of the inductor included in the voltage conversion circuit 2.

Since the output current In is generated depending on the detection current Is as described above, when the detection current Is exceeds a predetermined value, for example, the control circuit 8 stops the operation of the voltage conversion circuit 2, whereby the output current In can be lowered. Hence, overcurrent protection of the voltage converter can be attained. Furthermore, in the case that high-speed impedance change occurs in the load 11, the control circuit 8 sets the control voltage V8 so that the output current In can follow the change with a desired transient response.

The semiconductor structures of the auxiliary switch circuits 3 and 5 are approximately equivalent to that of the main switch circuit 1, and the semiconductor sizes of the auxiliary switch circuits 3 and 5 are smaller than that of the main switch circuit 1. For this reason, the ON resistances of the auxiliary switch circuits 3 and 5 are higher than that of the main switch circuit 1. The semiconductor structure herein includes a circuit configuration, relative dimensional relationship in layout, semiconductor material and production process. In addition, the semiconductor size represents the size the circuit occupies on the semiconductor. Furthermore, it is assumed that the ratio of the semiconductor size of the main switch circuit 1 to those of the respective auxiliary switch circuits 3 and 5 is Sn:1:Sm (Sn is sufficiently larger than 1 and Sm). In this case, the auxiliary switch circuits 3 and 5 have semiconductor sizes 1/Sn and Sm/Sn times larger than that of the main switch circuit 1, respectively, and have ON resistances Sn and Sn/Sm times higher than that of the main switch circuit 1, respectively.

Since the adjustment circuit 6 performs adjustment so that the potential Vn is approximately equal to the potential Vr as described above, the potentials of the drain terminals of the main switch circuit 1 and the auxiliary switch circuits 3 and 5 are approximately equal to one another. Furthermore, since the adjustment circuit 4 performs adjustment so that the potential Vt is approximately equal to the potential Vq, the potentials of the source terminals of the main switch circuit 1 and the auxiliary switch circuits 3 and 5 are approximately equal to one another. Moreover, the potentials of the gate terminals of the main switch circuit 1 and the auxiliary switch circuits 3 and 5 are equal to one another.

Hence, when turned ON, the auxiliary detection currents Iq and Ir flowing from the drain terminals to the source terminals of the auxiliary switch circuits 3 and 5 are smaller than the output current It flowing from the drain terminal to the source terminal of the main switch circuit 1 (1/Sn and Sm/Sn times, respectively) and are approximately proportional to the output current It. As a result, the detection current Is is smaller than the output current It and approximately proportional to the output current It. The ratio of the auxiliary detection current Iq to the output current It is equal to the ratio of the semiconductor size of the auxiliary switch circuit 3 to the semiconductor size of the main switch circuit 1, that is, 1:Sn, and is the inverse of the ratio of the ON resistance of the auxiliary switch circuit 3 to the ON resistance of the main switch circuit 1. Similarly, the ratio of the auxiliary detection current Ir to the output current It is equal to the ratio of the semiconductor size of the auxiliary switch circuit 5 to the semiconductor size of the main switch circuit 1, that is, Sm:Sn, and is the inverse of the ratio of the ON resistance of the auxiliary switch circuit 5 to the ON resistance of the main switch circuit 1. As described above, the current detection circuit can generate the auxiliary detection currents Iq and Ir and the detection current Is being approximately proportional to the output current It and small to the extent that the currents do not adversely affect the output current It. Consequently, it is possible to accurately detect the output current It.

In the case that the output voltage Vt is equal to or higher than the positive reference voltage V70 generated by the reference voltage source 70, the selection circuit 7 generates a selection signal V7 representing high level, and in the case that the output voltage Vt is less than the reference voltage V70, the selection circuit 7 generates the selection signal V7 representing low level. In the case that the selection signal V7 is high level, the current adjustment detection circuit generates the detection current Is on the basis of the auxiliary detection current Iq, and in the case that the selection signal V7 is low level, the current adjustment detection circuit generates the detection current Is on the basis of the detection current Ir. More specifically, in the case that the selection signal V7 is high level, the selection circuit 7 sets the enable terminal of the adjustment circuit 4 to high level, thereby activating the adjustment circuit 4, and sets the disenable terminal of the adjustment circuit 6 to high level, thereby deactivating the adjustment circuit 6. In the case that the selection signal V7 is low level, the selection circuit 7 sets the enable terminal of the adjustment circuit 4 to low level, thereby deactivating the adjustment circuit 4, and sets the disenable terminal of the adjustment circuit 6 to low level, thereby activating the adjustment circuit 6. When the adjustment circuits 4 and 6 are deactivated, the auxiliary detection currents Iq and Ir corresponding thereto respectively are set to approximately zero. The reference voltage source 70 is set to the lower limit value in the range of the output voltage Vt at which the adjustment circuit 4 can operate sufficiently.

The adjustment circuit 4 is configured to pass the auxiliary detection current Iq in a direction of receiving the current from the source terminal of the auxiliary switch circuit 3, and the adjustment circuit 6 is configured to pass the auxiliary detection current Ir in a direction of outputting the current to the drain terminal of the auxiliary switch circuit 5. Each of the auxiliary detection currents Iq and Ir flows in one direction, from the positive power source potential Vc to the ground potential. Furthermore, the source potentials of the main switch circuit 1 and the auxiliary switch circuits 3 and 5, being approximately equal to one another, are lower than the drain potentials of the main switch circuit 1 and the auxiliary switch circuits 3 and 5, being approximately equal to one another, by the ON voltage of the main switch circuit 1. Hence, the potential of the adjustment circuit 4 is present in the potential range from the source potential of the main switch circuit 1 to the ground potential (in other words, the potential range on the side of the ground potential). The potential range on the side of the ground potential is also referred to as the potential range on the side of the load potential since the potential of the load 11 is present therein. On the other hand, the potential of the adjustment circuit 6 is present in the potential range from the power source potential Vc to the drain potential of the main switch circuit 1 (in other words, the potential range on the side of the power source potential Vc).

In a state in which the output potential Vt is sufficiently high, since the potential range on the side of the ground potential is sufficiently wide, the adjustment circuit 4 is activated, and the auxiliary detection current Iq is generated accurately. On the other hand, when the output potential Vt becomes low and the potential range on the side of ground potential becomes narrow, the adjustment circuit 4 cannot securely obtain an operating voltage. Conversely, since the potential range on the side of the power source potential Vc becomes sufficiently wide, the adjustment circuit 6 can securely obtain a sufficient operating voltage. Hence, the adjustment circuit 6 is activated, and the auxiliary detection current Ir is generated accurately.

As described above, the current detection circuit and the voltage converter using the current detection circuit according to the first embodiment are configured so that the potential range is separated, that is, the potential of the adjustment circuit 4 is present in the potential range on the side of the ground potential and the potential of the adjustment circuit 6 is present in the potential range on the side of the power source potential Vc. Hence, the auxiliary detection current can be generated accurately in either one of the ranges, and the output current It can be detected accurately.

The main switch circuit 1 and the auxiliary switch circuits 3 and 5 may each be formed of a linearly operating device, such as a series regulator, or a switching device, such as a switching regulator. Furthermore, although the main switch circuit 1 and the auxiliary switch circuits 3 and 5 are each formed of an NMOS transistor, the circuits may also each be formed of a PMOS transistor. Moreover, although the MOS transistors 41 and 61 are each formed of a PMOS transistor, the MOS transistors may also each be formed of an NMOS transistor. In this case, the positive/negative polarities at the input terminals of the amplifiers 40 and 60 are required to be reversed to each other.

Second Embodiment

In a second embodiment, differences from the first embodiment will be mainly described. Since the other configurations, operations and effects are similar to those of the first embodiment, descriptions thereof are omitted.

Figure 2:
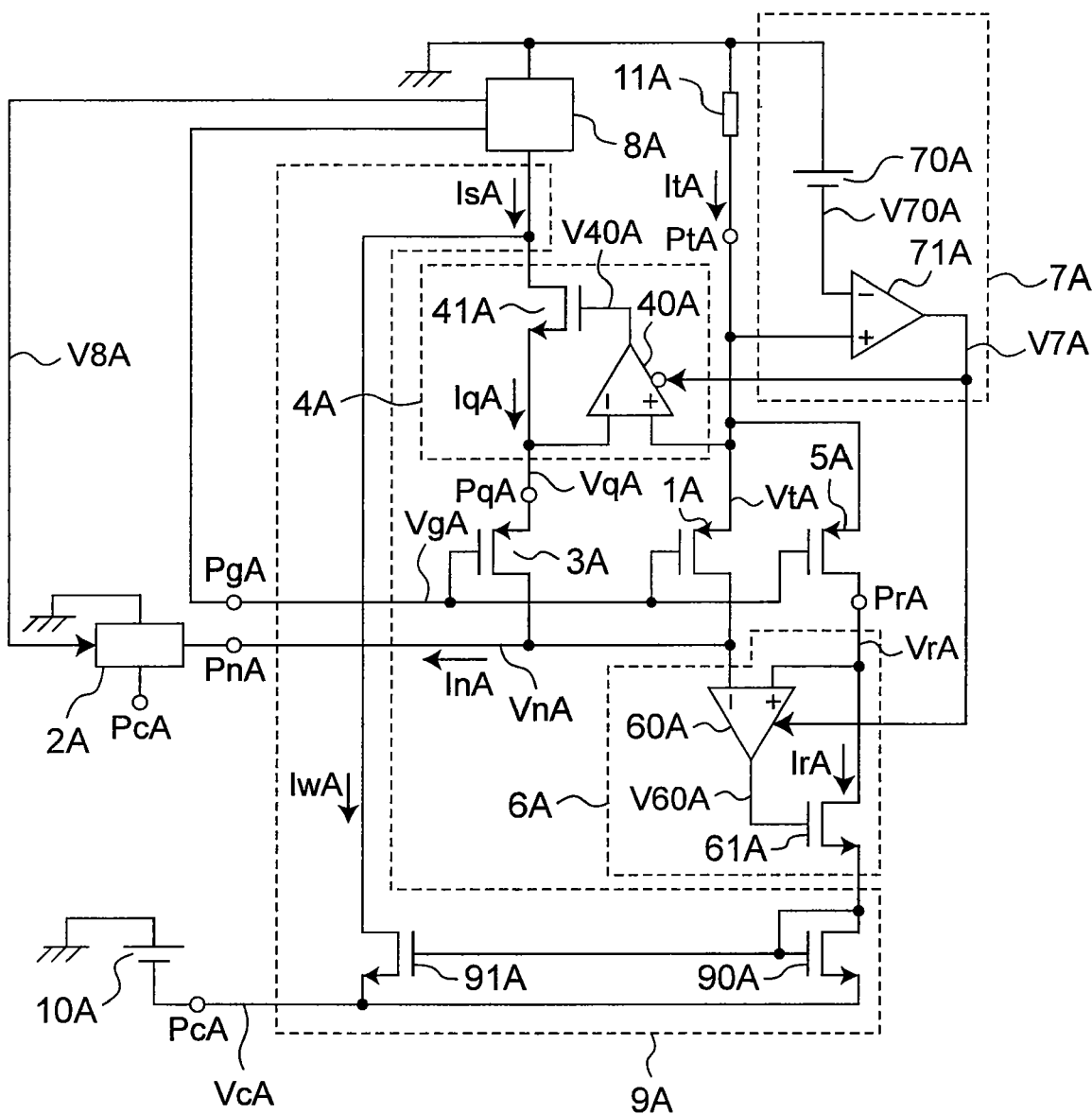
FIG. 2 is a circuit diagram showing the configuration of a current detection circuit and a voltage converter using the current detection circuit according to a second embodiment of the present invention.

FIG. 2 is a circuit diagram showing the configuration of a current detection circuit and a voltage converter using the current detection circuit in the second embodiment. In FIG. 2, the current detection circuit includes a main switch circuit 1A, an auxiliary switch circuit 3A, an auxiliary switch circuit 5A, an adjustment circuit 4A, an adjustment circuit 6A, a detection current generating circuit 9A, and a selection circuit 7A. The voltage converter includes the above-mentioned current detection circuit, a control circuit 8A, a DC power source 10A, a voltage conversion circuit 2A, and a load 11A. The main switch circuit 1A and the auxiliary switch circuits 3A and 5A are each formed of a PMOS transistor. The adjustment circuit 4A includes an amplifier 40A and an NMOS transistor 41A. The adjustment circuit 6A includes an amplifier 60A and an NMOS transistor 61A. The detection current generating circuit 9A includes an NMOS transistor 90A and an NMOS transistor 91A. The selection circuit 7A includes a reference voltage source 70A and a comparator 71A.

The adjustment circuits 4A and 6A and the detection current generating circuit 9A constitute a current adjustment detection circuit. Each of the NMOS transistors 41A and 61A is an example of an adjuster. The NMOS transistors 90A and 91A constitute a current mirror circuit. The DC power source 10A and the voltage conversion circuit 2A constitute a power source circuit.

The power source terminal of the voltage conversion circuit 2A is connected to the negative electrode of the DC power source 10A via a terminal PcA, and the positive electrode of the DC power source 10A is grounded. The drain terminal of the main switch circuit 1A is connected to the output terminal of the voltage conversion circuit 2A via a terminal PnA, the source terminal of the main switch circuit 1A is connected to one terminal of the load 11A via an output terminal PtA, and the other terminal of the load 11A is grounded. The drain terminal of the auxiliary switch circuit 3A is connected to the terminal PnA, and the source terminal of the auxiliary switch circuit 3A is connected to the adjustment circuit 4A via a terminal PqA. The drain terminal of the auxiliary switch circuit 5A is connected to the adjustment circuit 6A via a terminal PrA, and the source terminal of the auxiliary switch circuit 5A is connected to the output terminal PtA.

In the adjustment circuit 4A, the non-inverting input terminal of the amplifier 40A is connected to the output terminal PtA, the inverting input terminal of the amplifier 40A is connected to the terminal PqA, the output terminal of the amplifier 40A is connected to the gate terminal of the NMOS transistor 41A. The source terminal of the NMOS transistor 41A is connected to the terminal PqA, and the drain terminal of the NMOS transistor 41A serves as a terminal of the adjustment circuit 4A and connected to the detection current generating circuit 9A. In the adjustment circuit 6A, the inverting input terminal of the amplifier 60A is connected to the terminal PnA, the non-inverting input terminal of the amplifier 60A is connected to the terminal PrA, and the output terminal of the amplifier 60A is connected to the gate terminal of the NMOS transistor 61A. The drain terminal of the NMOS transistor 61A is connected to the terminal PrA, and the source terminal of the NMOS transistor 61A serving as a terminal of the adjustment circuit 6A is connected to the detection current generating circuit 9A.

In the detection current generating circuit 9A, the drain terminal of the NMOS transistor 90A included in the current mirror circuit is connected to the source terminal of the NMOS transistor 61A, and the drain terminal of the NMOS transistor 91A also included in the current mirror circuit is connected to the drain terminal of the NMOS transistor 41A and connected to the control circuit 8A. The source terminals of the NMOS transistors 90A and 91A are connected to the terminal PcA. In the selection circuit 7A, the non-inverting input terminal of the comparator 71A is connected to the output terminal PtA, the inverting input terminal of the comparator 71A is connected to the negative electrode of the reference voltage source 70A, and the positive electrode of the reference voltage source 70A is grounded. The output terminal of the comparator 71A is connected to the enable terminal of the amplifier 40A and to the disenable terminal of the amplifier 60A.

The DC power source 10A generates a negative DC power source voltage VcA. The voltage conversion circuit 2A raises or lowers the DC power source voltage VcA and generates an output voltage VnA and an output current InA. When turned ON, the main switch circuit 1A passes an output current ItA approximately equal to the output current InA to the load 11A.

When turned ON, the auxiliary switch circuit 3A shunts part of the output current InA and generates an auxiliary detection current IqA. The adjustment circuit 4A adjusts the auxiliary detection current IqA using negative feedback operation so that an output potential VtA at the output terminal PtA becomes equal to a potential VqA at the terminal PqA. More specifically, the amplifier 40A generates an amplified signal V40A that changes linearly with respect to the difference between the output potential VtA and the potential VqA. Controlled by the amplified signal V40A, the NMOS transistor 41A adjusts the auxiliary detection current IqA flowing to the auxiliary switch circuit 3A so that the difference between the output potential VtA and the potential VqA is approximately zero. In the case that the potential VqA is lower than the output potential VtA, the potential of the amplified signal V40A rises, and the NMOS transistor 41A increases the auxiliary detection current Iq. As a result, the potential VqA rises. In the case that the potential VqA is higher than the output potential VtA, the potential of the amplified signal V40A lowers, and the NMOS transistor 41A decreases the auxiliary detection current IqA. As a result, the potential VqA lowers.

When turned ON, the auxiliary switch circuit 5A shunts part of the output current ItA and generates an auxiliary detection current IrA. The adjustment circuit 6A adjusts the auxiliary detection current IrA using negative feedback operation so that the potential VnA at the terminal PnA becomes equal to a potential VrA at the terminal PrA. More specifically, the amplifier 60A generates an amplified signal V60A that changes linearly with respect to the difference between the potential VnA and the potential VrA. Controlled by the amplified signal V60A, the NMOS transistor 61A adjusts the auxiliary detection current IrA flowing from the auxiliary switch circuit 5A so that the difference between the potential VnA and the potential VrA is approximately zero. In the case that the potential VrA is higher than the potential VnA, the potential of the amplified signal V60A rises, and the NMOS transistor 61A increases the auxiliary detection current IrA. As a result, the potential VrA lowers. In the case that the potential VrA is lower than the potential VnA, the potential of the amplified signal V60A lowers, and the NMOS transistor 61A decreases the auxiliary detection current IrA. As a result, the potential VrA rises.

The current mirror circuit generates a current mirror current IwA that is approximately equal to the auxiliary detection current IrA. The detection current generating circuit 9A generates a detection current IsA representing the sum of the current mirror current IwA and the auxiliary detection current IqA.

The control circuit 8A generates a control voltage V8A on the basis of the detection current IsA. A switching transistor inside the voltage conversion circuit 2A is turned ON/OFF on the basis of the control voltage V8A, whereby the voltage conversion circuit 2A raises or lowers the DC voltage VcA and generates the output current InA. Instead of the control voltage V8A, multiple control voltages may be used depending on the number of switching transistors to be controlled. Furthermore, the control circuit 8A generates a control voltage VgA on the basis of the detection current IsA and applies the control voltage VgA to the gate terminals of the main switch circuit 1A and the auxiliary switch circuits 3A and 5A via a control terminal PgA. The main switch circuit 1A and the auxiliary switch circuits 3A and 5A are turned ON/OFF simultaneously on the basis of the control voltage VgA. During voltage-lowering operation, the main switch circuit 1A and the auxiliary switch circuits 3A and 5A are turned ON at all times, and during voltage-raising operation, the switches are turned ON at the time of discharge of the inductor included in the voltage conversion circuit 2A.

Since the output current InA is generated depending on the detection current IsA as described above, when the detection current IsA exceeds a predetermined value, for example, the control circuit 8A stops the operation of the voltage conversion circuit 2A, whereby the output current InA can be lowered. Hence, overcurrent protection of the voltage converter can be attained. Furthermore, in the case that high-speed impedance change occurs in the load 11A, the control circuit 8A sets the control voltage V8A so that the output current InA can follow the change with a desired transient response.

The semiconductor structures of the auxiliary switch circuits 3A and 5A are approximately equivalent to that of the main switch circuit 1A, and the semiconductor sizes of the auxiliary switch circuits 3A and 5A are smaller than that of the main switch circuit 1A. For this reason, the ON resistances of the auxiliary switch circuits 3A and 5A are higher than that of the main switch circuit 1A. It is assumed that the ratio of the semiconductor size of the main switch circuit 1A to those of the respective auxiliary switch circuits 3A and 5A is Sn:1:Sm (Sn is sufficiently larger than 1 and Sm). In this case, the auxiliary switch circuits 3A and 5A have semiconductor sizes 1/Sn and Sm/Sn times larger than that of the main switch circuit 1A, respectively, and have ON resistances Sn and Sn/Sm times higher than that of the main switch circuit 1A, respectively.

Since the adjustment circuit 6A performs adjustment so that the potential VnA is approximately equal to the potential VrA as described above, the potentials of the drain terminals of the main switch circuit 1A and the auxiliary switch circuits 3A and 5A are approximately equal to one another. Furthermore, since the adjustment circuit 4A performs adjustment so that the potential VtA is approximately equal to the potential VqA, the potentials of the source terminals of the main switch circuit 1A and the auxiliary switch circuits 3A and 5A are approximately equal to one another. Moreover, the potentials of the gate terminals of the main switch circuit 1A and the auxiliary switch circuits 3A and 5A are equal to one another.

Hence, when turned ON, the auxiliary detection currents IqA and IrA flowing from the source terminals to the drain terminals of the auxiliary switch circuits 3A and 5A are smaller than the output current ItA flowing from the source terminal to the drain terminal of the main switch circuit 1A (1/Sn and Sm/Sn times, respectively) and are approximately proportional to the output current ItA. As a result, the detection current IsA is smaller than the output current ItA and approximately proportional to the output current ItA. The ratio of the auxiliary detection current IqA to the output current ItA is equal to the ratio of the semiconductor size of the auxiliary switch circuit 3A to the semiconductor size of the main switch circuit 1A, that is, 1:Sn, and is the inverse of the ratio of the ON resistance of the auxiliary switch circuit 3A to the ON resistance of the main switch circuit 1A. Similarly, the ratio of the auxiliary detection current IrA to the output current ItA is equal to the ratio of the semiconductor size of the auxiliary switch circuit 5A to the semiconductor size of the main switch circuit 1A, that is, Sm:Sn, and is the inverse of the ratio of the ON resistance of the auxiliary switch circuit 5A to the ON resistance of the main switch circuit 1A. As described above, the current mirror circuit can generate the auxiliary detection currents IqA and IrA and the detection current IsA being approximately proportional to the output current ItA and small to the extent that the currents do not adversely affect the output current ItA. Consequently, it is possible to accurately detect the output current ItA.

In the case that the output voltage VtA is equal to or higher than the negative reference voltage V70A generated by the reference voltage source 70A, the selection circuit 7A generates a selection signal V7A representing high level, and in the case that the output voltage VtA is less than the reference voltage V70A, the selection circuit 7A generates the selection signal V7A representing low level. In the case that the selection signal V7A is high level, the current adjustment detection circuit generates the detection current IsA on the basis of the auxiliary detection current IrA, and in the case that the selection signal V7A is low level, the current adjustment detection circuit generates the detection current IsA on the basis of the detection current IqA. More specifically, in the case that the selection signal V7A is high level, the selection circuit 7A sets the enable terminal of the adjustment circuit 6A to high level, thereby activating the adjustment circuit 6A, and sets the disenable terminal of the adjustment circuit 4A to high level, thereby deactivating the adjustment circuit 4A. In the case that the selection signal V7A is low level, the selection circuit 7A sets the enable terminal of the adjustment circuit 6A to low level, thereby deactivating the adjustment circuit 6A, and sets the disenable terminal of the adjustment circuit 4A to low level, thereby activating the adjustment circuit 4A. When the adjustment circuits 4A and 6A are deactivated, the auxiliary detection currents IqA and IrA corresponding thereto respectively are set to approximately zero. The reference voltage source 70A is set to the upper limit value in the range of the output voltage Vta at which the adjustment circuit 4A can operate sufficiently.

The adjustment circuit 6A is configured to pass the auxiliary detection current IrA in a direction of receiving the current from the drain terminal of the auxiliary switch circuit 5A, and the adjustment circuit 4A is configured to pass the auxiliary detection current IqA in a direction of outputting the current to the source terminal of the auxiliary switch circuit 3A. Each of the auxiliary detection currents IqA and IrA flows in one direction, from the ground potential to the negative power source potential VcA. Furthermore, the drain potentials of the main switch circuit 1A and the auxiliary switch circuits 3A and 5A, being approximately equal to one another, are lower than the source potentials of the main switch circuit 1A and the auxiliary switch circuits 3A and 5A, being approximately equal to one another, by the ON voltage of the main switch circuit 1A. Hence, the potential of the adjustment circuit 6A is present in the potential range from the drain potential of the main switch circuit 1A to the power source potential VcA (in other words, the potential range on the side of the power source potential VcA). On the other hand, the potential of the adjustment circuit 4A is present in the potential range from the ground potential to the source potential of the main switch circuit 1A (in other words, the potential range on the side of the ground potential). The potential range on the side of the ground potential is also referred to as the potential range on the side of the load potential since the potential of the load 11A is present therein.

In a state in which the output potential VtA is sufficiently low, since the potential range on the side of the ground potential is sufficiently wide, the adjustment circuit 4A is activated, and the auxiliary detection current IqA is generated accurately. On the other hand, when the output potential VtA becomes high and the potential range on the side of ground potential becomes narrow, the adjustment circuit 4A cannot securely obtain an operating voltage. Conversely, since the potential range on the side of the power source potential VcA becomes sufficiently wide, the adjustment circuit 6A can securely obtain a sufficient operating voltage. Hence, the adjustment circuit 6A is activated, and the auxiliary detection current IrA is generated accurately.

As described above, the current detection circuit and the voltage converter using the current detection circuit according to the second embodiment are configured so that the potential range is separated, that is, the potential of the adjustment circuit 4A is present in the potential range on the side of the ground potential and the potential of the adjustment circuit 6A is present in the potential range on the side of the power source potential VcA. Hence, the auxiliary detection current can be generated accurately in either one of the ranges, and the output current ItA can be detected accurately.

The main switch circuit 1A and the auxiliary switch circuits 3A and 5A may each be formed of a linearly operating device, such as a series regulator, or a switching device, such as a switching regulator. Furthermore, although the main switch circuit 1A and the auxiliary switch circuits 3A and 5A are each formed of a PMOS transistor, the circuits may also each be formed of an NMOS transistor. Moreover, although the MOS transistors 41A and 61A are each formed of an NMOS transistor, the MOS transistors may also each be formed of a PMOS transistor. In this case, the positive/negative polarities at the input terminals of the amplifiers 40A and 60A are required to be reversed to each other.

Third Embodiment

In a third embodiment, differences from the first and second embodiments will be mainly described. Since the other configurations, operations and effects are similar to those of the first and second embodiments, descriptions thereof are omitted.

Figure 3:
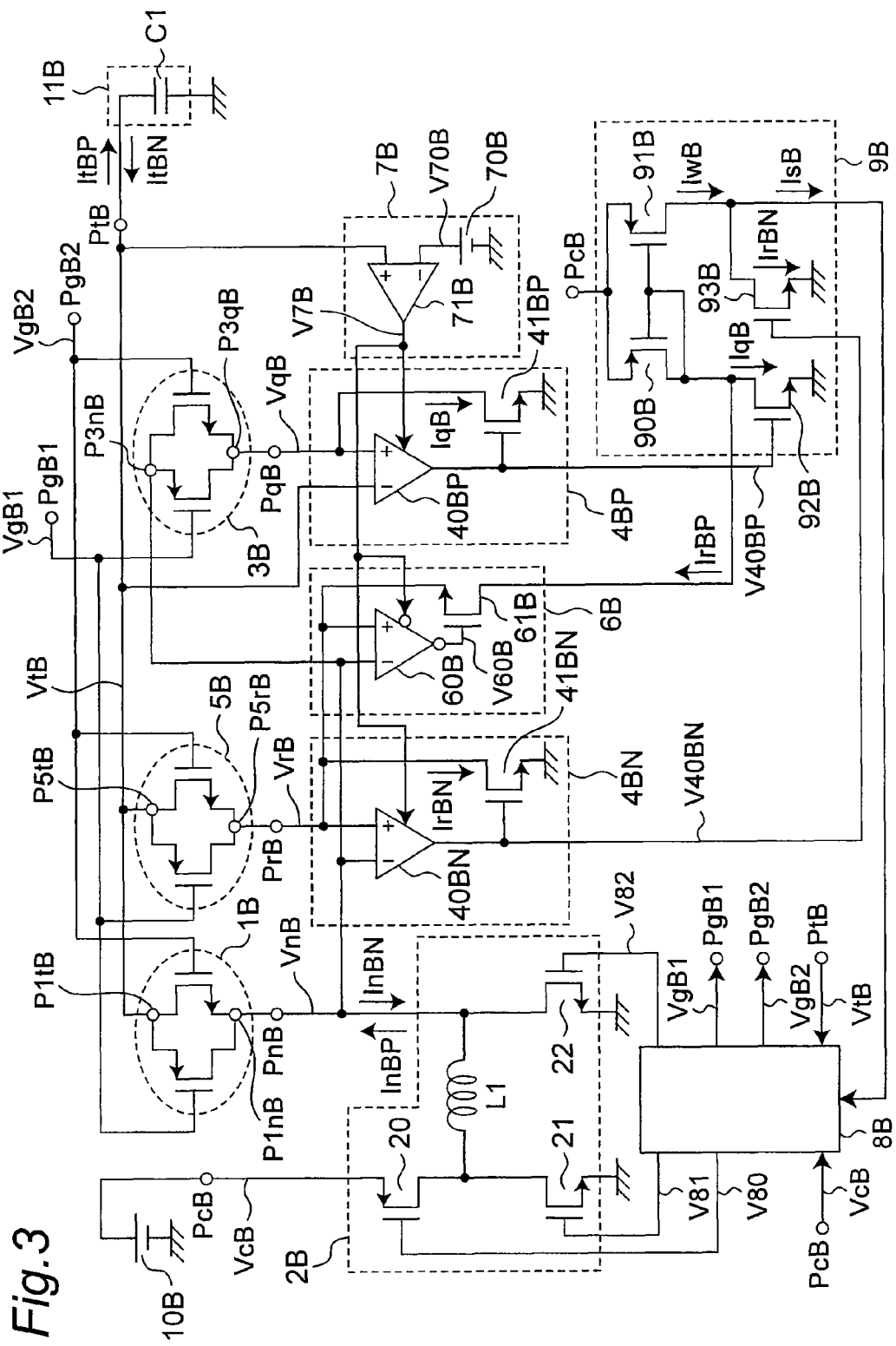
FIG. 3 is a circuit diagram showing the configuration of a current detection circuit and a voltage converter using the current detection circuit according to a third embodiment of the present invention.
Figure 4:
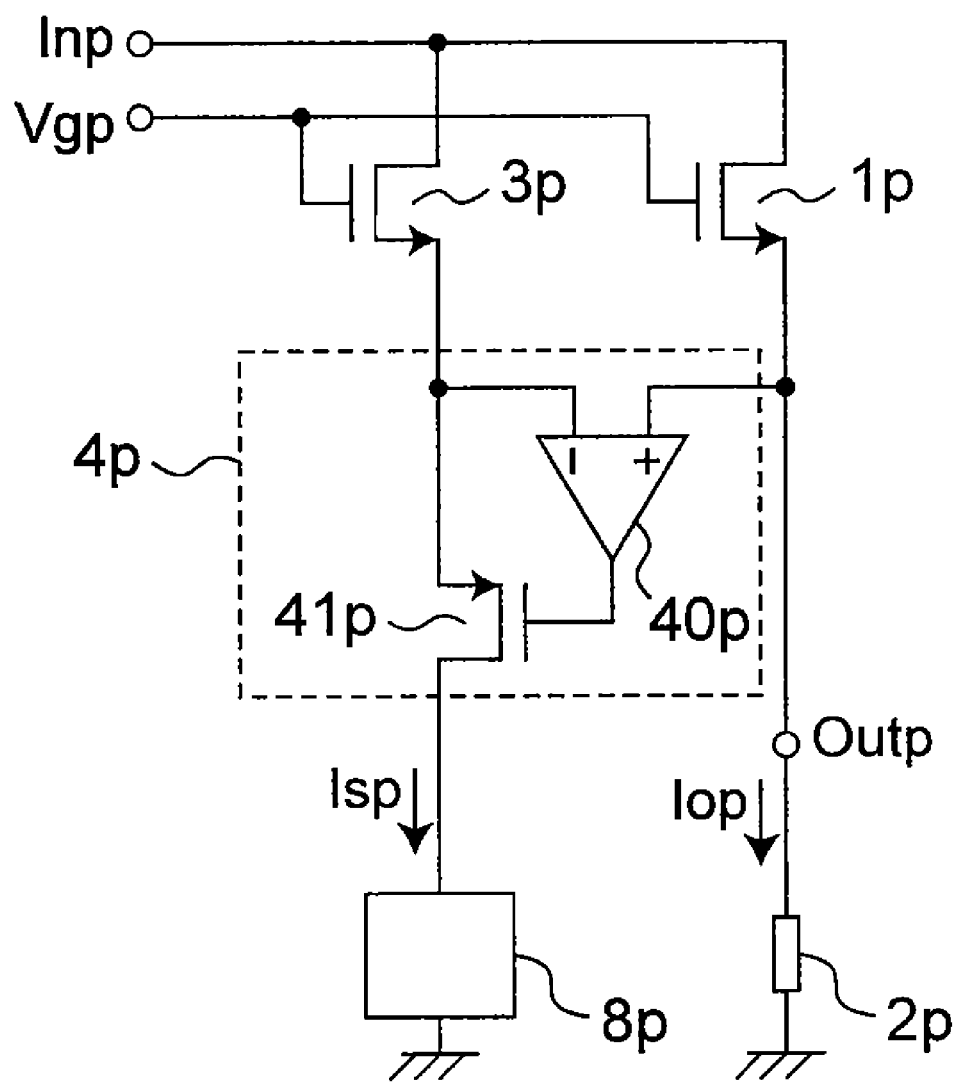
FIG. 4 is a circuit diagram showing the configuration of the current detection circuit according to the conventional example.

FIG. 3 is a circuit diagram showing the configuration of a current detection circuit and a voltage converter using the current detection circuit in the third embodiment. In FIG. 3, the current detection circuit includes a main switch circuit 1B, an auxiliary switch circuit 3B, an auxiliary switch circuit 5B, an adjustment circuit 4BP, an adjustment circuit 4BN, an adjustment circuit 6B, a detection current generating circuit 9B, and a selection circuit 7B. The voltage converter includes the above-mentioned current detection circuit, a control circuit 8B, a DC power source 10B, a voltage conversion circuit 2B, and a load 11B.

The main switch circuit 1B and the auxiliary switch circuits 3B and 5B are each formed of a parallel circuit of a PMOS transistor and an NMOS transistor. The adjustment circuit 4BP includes an amplifier 40BP and an NMOS transistor 41BP. The adjustment circuit 4BN includes an amplifier 40BN and an NMOS transistor 41BN. The adjustment circuit 6B includes an inverting amplifier 60B and an NMOS transistor 61B. The detection current generating circuit 9B includes a PMOS transistor 90B, a PMOS transistor 91B, an NMOS transistor 92B and an NMOS transistor 93B. The selection circuit 7B includes a reference voltage source 70B and a comparator 71B.

The voltage conversion circuit 2B includes a PMOS transistor 20, an NMOS transistor 21, an NMOS transistor 22 and an inductor L1. The load 11B includes a capacitor C1.

The adjustment circuits 4BP, 4BN and 6B and the detection current generating circuit 9B constitute a current adjustment detection circuit. Each of the NMOS transistors 41BP, 41BN and 61B is an example of an adjuster. The PMOS transistors 90B and 91B constitute a current mirror circuit. The DC power source 10B and the voltage conversion circuit 2B constitute a power source circuit.

The power source terminal of the voltage conversion circuit 2B is connected to the positive electrode of the DC power source 10B via a terminal PcB, and the negative electrode of the DC power source 10B is grounded. In the voltage conversion circuit 2B, the source terminal of the PMOS transistor 20 is connected to the power source terminal of the voltage conversion circuit 2B. The drain terminal of the PMOS transistor 20 is connected to one terminal of the inductor L1 and the drain terminal of the NMOS transistor 21, and the source terminal of the NMOS transistor 21 is grounded. The other terminal of the inductor L1 is connected to the output terminal of the voltage conversion circuit 2B and the drain terminal of the NMOS transistor 22, and the source terminal of the NMOS transistor 22 is grounded.

The main switch circuit 1B is inserted between a terminal P1nB and a terminal P1tB. The terminal P1nB is connected to the drain terminal of the PMOS transistor and the source terminal of the NMOS transistor, and the terminal P1tB is connected to the source terminal of the PMOS transistor and the drain terminal of the NMOS transistor. The terminal P1nB is connected to the output terminal of the voltage conversion circuit 2B via a terminal PnB, the terminal P1tB is connected to one terminal of the load 11B (that is, the capacitor C1) via an output terminal PtB, and the other terminal of the load 11B (that is, the capacitor C1) is grounded.

The auxiliary switch circuit 3B is inserted between a terminal P3nB and a terminal P3qB. The terminal P3nB is connected to the source terminal of the PMOS transistor and the drain terminal of the NMOS transistor, and the terminal P3qB is connected to the drain terminal of the PMOS transistor and the source terminal of the NMOS transistor. The terminal P3qB is connected to the adjustment circuit 4BP via a terminal PqB, and the terminal P3nB is connected to the terminal PnB. The auxiliary switch circuit 5B is inserted between a terminal P5rB and a terminal P5tB. The terminal P5rB is connected to the drain terminal of the PMOS transistor and the source terminal of the NMOS transistor, and the terminal P5tB is connected to the source terminal of the PMOS transistor and the drain terminal of the NMOS transistor. The terminal P5rB is connected to the adjustment circuits 4BN and 6B via a terminal PrB, and the terminal P5tB is connected to the output terminal PtB.

In the adjustment circuit 4BP, the inverting input terminal of the amplifier 40BP is connected to the output terminal PtB, the non-inverting input terminal of the amplifier 40BP is connected to the terminal PqB, and the output terminal of the amplifier 40BP is connected to the gate terminal of the NMOS transistor 41BP. The drain terminal of the NMOS transistor 41BP is connected to the terminal PqB, and the source terminal of the NMOS transistor 41BP is grounded. In the adjustment circuit 4BN, the inverting input terminal of the amplifier 40BN is connected to the output terminal PnB, the non-inverting input terminal of the amplifier 40BN is connected to the terminal PrB, and the output terminal of the amplifier 40BN is connected to the gate terminal of the NMOS transistor 41BN. The drain terminal of the NMOS transistor 41BN is connected to the terminal PrB, and the source terminal of the NMOS transistor 41BN is grounded.

In the adjustment circuit 6B, the inverting input terminal of the inverting amplifier 60B is connected to the terminal PnB, the non-inverting input terminal of the amplifier 60B is connected to the terminal PrB, and the output terminal of the inverting amplifier 60B is connected to the gate terminal of the NMOS transistor 61B. The source terminal of the NMOS transistor 61B is connected to the terminal PrB, and the drain terminal of the NPMOS transistor 61 serving as a terminal of the adjustment circuit 6B is connected to the detection current generating circuit 9B.

In the detection current generating circuit 9B, the drain terminal of the PMOS transistor 90B included in the current mirror circuit is connected to the drain terminal of the NMOS transistor 61B and the drain terminal of the NMOS transistor 92B. The drain terminal of the PMOS transistor 91B also included in the current mirror circuit is connected to the drain terminal of the NMOS transistor 93B and to the control circuit 8B. The source terminals of the PMOS transistors 90B and 91B are connected to the terminal PcB, and the source terminals of the NMOS transistors 92B and 93B are grounded. The gate terminal of the NMOS transistor 92B is connected to the gate terminal of the NMOS transistor 41BP, and the gate terminal of the NMOS transistor 93B is connected to the gate terminal of the NMOS transistor 41BN.

In the selection circuit 7B, the non-inverting input terminal of the comparator 71B is connected to the output terminal PtB, the inverting input terminal of the comparator 71B is connected to the positive electrode of the reference voltage source 70B, and the negative electrode of the reference voltage source 70B is grounded. The output terminal of the comparator 71B is connected to the enable terminals of the amplifiers 40BP and 40BN and to the disenable terminal of the inverting amplifier 60B.

The DC power source 10B generates a positive DC power source voltage VcB. The voltage conversion circuit 2B raises or lowers the DC power source voltage VcB and generates an output voltage VnB and an output current InBP. When receiving the output current InBP from the voltage conversion circuit 2B and turned ON, the main switch circuit 1B passes an output current ItBP approximately equal to the output current InBP to the load 11B. On the other hand, when receiving the output current ItBN from the load 11B and turned ON, the main switch circuit 1B passes an output current InBN approximately equal to the output current ItBN to the voltage conversion circuit 2B. In other words, when turned ON, the main switch circuit 1B performs passing of the output currents InBP, InBN, ItBP and InBN to and from the load 11B.

As described above, the main switch circuit 1B is formed of a parallel configuration of a PMOS transistor and an NMOS transistor. For this reason, even in the case that its output voltage VtB is low and the PMOS transistor cannot be turned ON sufficiently, the NMOS transistor can be turned ON sufficiently due to the difference between the DC power source voltage VcB and the output voltage VtB. Hence, the main switch circuit 1B can be turned ON/OFF by control voltages VgB1 and VgB2 regardless of the voltages at the terminals P1nB and P1tB.

When turned ON, the auxiliary switch circuit 3B shunts part of the output current InBP and generates an auxiliary detection current IqB. The adjustment circuit 4BP adjusts the auxiliary detection current IqB using negative feedback operation so that the output potential VtB at the output terminal PtB becomes equal to a potential VqB at the terminal PqB. More specifically, the amplifier 40BP generates an amplified signal V40BP that changes linearly with respect to the difference between the output potential VtB and the potential VqB. Controlled by the amplified signal V40BP, the NMOS transistor 41BP adjusts the auxiliary detection current IqB flowing from the auxiliary switch circuit 3B so that the difference between the output potential VtB and the potential VqB is approximately zero. In the case that the output potential VnB is higher than the output potential VtB, in other words, in the case that the output current ItBP flows, the auxiliary detection current IqB flows from the auxiliary switch circuit 3B. Hence, in the case that the output current ItBN flows, the auxiliary detection current IqB does not flow. In the case that the potential VqB is higher than the output voltage VtB, the potential of the amplified signal V40BP rises, and the NMOS transistor 41BP increases the auxiliary detection current IqB. As a result, the potential VqB lowers. In the case that the potential VqB is lower than the output potential VtB, the potential of the amplified signal V40BP lowers, and the NMOS transistor 41BP decreases the auxiliary detection current IqB. As a result, the potential VqB rises.

When turned ON, the auxiliary switch circuit 5B shunts part of the output current ItBP and generates an auxiliary detection current IrBP. The adjustment circuit 6B adjusts the auxiliary detection current IrBP using negative feedback operation so that the potential VnB at the terminal PnB becomes equal to a potential VrB at the terminal PrB. More specifically, the inverting amplifier 60B generates an amplified signal V60B that changes linearly with respect to the difference between the potential VnB and the potential VrB. Controlled by the amplified signal V60B, the NMOS transistor 61B adjusts the auxiliary detection current IrBP flowing to the auxiliary switch circuit 5B so that the difference between the potential VnB and the potential VrB is approximately zero. In the case that the output potential VnB is higher than the output potential VtB, in other words, in the case that the output current ItBP flows, the auxiliary detection current IrBP flows to the auxiliary switch circuit 5B. Hence, in the case that the output current ItBN flows, the auxiliary detection current IrBP does not flow. In the case that the potential VrB is higher than the potential VnB, the potential of the amplified signal V60B lowers, and the NMOS transistor 61B increases the auxiliary detection current IrBP. As a result, the potential VrB lowers. In the case that the potential VrB is lower than the potential VnB, the potential of the amplified signal V60B rises, and the NMOS transistor 61B decreases the auxiliary detection current IrBP. As a result, the potential VrB rises.

When turned ON, the auxiliary switch circuit 5B shunts part of the output current ItBN and generates an auxiliary detection current IrBN. The adjustment circuit 4BN adjusts the auxiliary detection current IrBN using negative feedback operation so that the potential VnB at the terminal PnB becomes equal to the potential VrB at the terminal PrB. More specifically, the amplifier 40BN generates an amplified signal V40BN that changes linearly with respect to the difference between the potential VnB and the potential VrB. Controlled by the amplified signal V40BN, the NMOS transistor 41BN adjusts the auxiliary detection current IrBN flowing from the auxiliary switch circuit 5B so that the difference between the potential VnB and the potential VrB is approximately zero. In the case that the output potential VnB is lower than the output potential VtB, in other words, in the case that the output current ItBN flows, the auxiliary detection current IrBN flows from the auxiliary switch circuit 5B. Hence, in the case that the output current ItBP flows, the auxiliary detection current IrBN does not flow. In the case that the potential VrB is higher than the potential VnB, the potential of the amplified signal V40BN rises, the NMOS transistor 41BN increases the auxiliary detection current IrBN. As a result, the potential VrB lowers. In the case that the potential VrB is lower than the potential VnB, the potential of the amplified signal V40BN lowers, and the NMOS transistor 41BN decreases the auxiliary detection current IrBN. As a result, the potential VrB rises.

In the detection current generating circuit 9B, the semiconductor structure and the semiconductor size of the NMOS transistor 92B are approximately equal to those of the NMOS transistor 41BP. Hence, like the NMOS transistor 41BP, the NMOS transistor 92B is controlled by the amplified signal V40BP and generates the auxiliary detection current IqB flowing from the drain terminal to the source terminal. The semiconductor structure and the semiconductor size of the NMOS transistor 93B are approximately equal to those of the NMOS transistor 41BN. Hence, like the NMOS transistor 41BN, the NMOS transistor 93B is controlled by the amplified signal V40BN and generates the auxiliary detection current IrBN flowing from the drain terminal to the source terminal.

The current mirror circuit generates a current mirror current IwB that is approximately equal to the sum of the auxiliary detection current IqB and the auxiliary detection current IrBP. The detection current generating circuit 9B generates a detection current IsB representing the current obtained by subtracting the auxiliary detection current IrBN from the current mirror current IwB. As described above, in the case that the output current ItBP flows, the auxiliary detection currents IqB and IrBP flow, but the auxiliary detection current IrBN does not flow. On the other hand, in the case that the output current ItBN flows, the auxiliary detection current IrBN flows, but the auxiliary detection currents IqB and IrBP do not flow. In this way, in the detection current generating circuit 9B, the current mirror current IwB is used as the detection current IsB in response to output current ItBP, and the auxiliary detection current IrBN is used as the detection current IsB in response to the output current ItBN.

The control circuit 8B generates a control voltage V80, a control voltage V81 and a control voltage V82 on the basis of the detection current IsB, the DC power source voltage VcB and the output voltage VtB. The MOS transistors 20, 21 and 22 are turned ON/OFF on the basis of the control voltages V80, V81 and V82, respectively, whereby the voltage conversion circuit 2B raises or lowers the DC power source voltage VcB, thereby generating the output currents InBP and InBN. Furthermore, the control circuit 8B generates control voltages VgB1 and VgB2 on the basis of the detection current IsB and applies the control voltages VgB1 and VgB2 to the gate terminals of the main switch circuit 1B and the auxiliary switch circuits 3B and 5B via control terminals PgB1 and PgB2, respectively. The main switch circuit 1B and the auxiliary switch circuits 3B and 5B are turned ON/OFF simultaneously on the basis of the control voltages VgB1 and VgB2.

In the case that the control circuit 8B controls the output voltage VtB to a desired voltage lower than the DC power source voltage VcB, the NMOS transistor 22 is held in the OFF state, and the main switch circuit 1B is held in the ON state. In this state, when the PMOS transistor 20 and the NMOS transistor 21 are turned ON alternately, the voltage conversion circuit 2B performs voltage-lowering operation. The output voltage VtB is obtained by VtB=VcB×DT20 assuming that the duty ratio of the ON period of the PMOS transistor 20 is DT20. The control circuit 8B adjusts the duty ratio DT20, thereby controlling the output voltage VtB to a desired low voltage.

In the case that the control circuit 8B controls the output voltage VtB to a desired voltage higher than the DC power source voltage VcB, the PMOS transistor 20 is held in the ON state, and the NMOS transistor 21 is held in the OFF state. In this state, when the NMOS transistor 22 is turned ON and the main switch circuit 1B is turned OFF, the inductor L1 is charged; on the other hand, when the NMOS transistor 22 is turned OFF and the main switch circuit 1B is turned ON, the inductor L1 is discharged. The voltage conversion circuit 2B performs voltage-raising operation in this way. The output voltage VtB is obtained by VtB=VcB/(1−DT22) assuming that the duty ratio of the ON period of the NMOS transistor 22 is DT22. The control circuit 8B adjusts the duty ratio DT22, thereby controlling the output voltage VtB to a desired high voltage.

Since the output currents InBP and InBN are generated depending on the detection current IsB as described above, when the detection current IsB exceeds a predetermined value, for example, the control circuit 8B stops the operation of the voltage conversion circuit 2B, whereby the output currents InBP and InBN can be lowered. Hence, overcurrent protection of the voltage converter can be attained. Furthermore, in the case that high-speed impedance change occurs in the load 11B, the control circuit 8B sets the control voltages V80, V81 and V82 so that the output currents InBP and InBN can follow the change with a desired transient response.

The semiconductor structures of the auxiliary switch circuits 3B and 5B are approximately equivalent to that of the main switch circuit 1B, and the semiconductor sizes of the auxiliary switch circuits 3B and 5B are smaller than that of the main switch circuit 1B. For this reason, the ON resistances of the auxiliary switch circuits 3B and 5B are higher than that of the main switch circuit 1B. It is assumed that the ratio of the semiconductor size of the main switch circuit 1B to those of the respective auxiliary switch circuits 3B and 5B is Sn:1:Sm (Sn is sufficiently larger than 1 and Sm). In this case, the auxiliary switch circuits 3B and 5B have semiconductor sizes 1/Sn and Sm/Sn times larger than that of the main switch circuit 1B, respectively, and have ON resistances Sn and Sn/Sm times higher than that of the main switch circuit 1B, respectively.

Since the adjustment circuit 6B performs adjustment so that the potential VnB is approximately equal to the potential VrB as described above, the potentials of the drain terminals of the main switch circuit 1B and the auxiliary switch circuits 3B and 5B are approximately equal to one another. Furthermore, since the adjustment circuit 4BP performs adjustment so that the potential VtB is approximately equal to the potential VqB, the potentials of the source terminals of the main switch circuit 1B and the auxiliary switch circuits 3B and 5B are approximately equal to one another. Moreover, the potentials of the gate terminals of the main switch circuit 1B and the auxiliary switch circuits 3B and 5B are equal to one another.

Hence, when turned ON, the auxiliary detection current IqB flowing from the terminal P3nB to the terminal P3qB of the auxiliary switch circuit 3B is smaller than the output current ItBP flowing from the terminal P1nB to the terminal P1tB of the main switch circuit 1B (1/Sn times) and is approximately proportional to the output current ItBP. Furthermore, when turned ON, the auxiliary detection current IrBP flowing from the terminal P5rB to the terminal P5tB of the auxiliary switch circuit 5B is smaller than the output current ItBP (Sm/Sn times) and is approximately proportional to the output current ItBP. Moreover, when turned ON, the auxiliary detection current IrBN flowing from the terminal P5tB to the terminal P5rB of the auxiliary switch circuit 5B is smaller than the output current ItBN flowing from the terminal P1tB to the terminal P1nB (Sm/Sn times) and is approximately proportional to the output current ItBN. As a result, the detection current IsB is smaller than the output currents ItBP and ItBN and approximately proportional to the output currents ItBP and ItBN.

The ratio of the auxiliary detection current IqB to the output current ItBP is equal to the ratio of the semiconductor size of the auxiliary switch circuit 3B to the semiconductor size of the main switch circuit 1B, that is, 1:Sn, and is the inverse of the ratio of the ON resistance of the auxiliary switch circuit 3B to the ON resistance of the main switch circuit 1B. Similarly, the respective ratios of the auxiliary detection currents IrBP and IrBN to the output currents ItBP and ItBN are equal to the ratio of the semiconductor size of the auxiliary switch circuit 5B to the semiconductor size of the main switch circuit 1B, that is, Sm:Sn, and are the inverse of the ratio of the ON resistance of the auxiliary switch circuit 5B to the ON resistance of the main switch circuit 1B. As described above, the current detection circuit can generate the auxiliary detection currents IqB and IrBP and the detection current IsB being approximately proportional to the output current ItBP and small to the extent that the currents do not adversely affect the output current ItBP. Similarly, the current detection circuit can generate the auxiliary detection current IrBN and the detection current IsB being approximately proportional to the output current ItBN and small to the extent that the currents do not adversely affect the output current ItBN. Consequently, it is possible to accurately detect the output currents ItBP and ItBN.

In the case that the output voltage VtB is equal to or higher than the positive reference voltage V70B generated by the reference voltage source 70B, the selection circuit 7B generates a selection signal V7B representing high level, and in the case that the output voltage VtB is less than the reference voltage V70B, the selection circuit 7B generates the selection signal V7B representing low level. In the case that the selection signal V7B is high level, the current adjustment detection circuit generates the detection current IsB on the basis of the auxiliary detection current IqB or the auxiliary detection current IrBN, and in the case that the selection signal V7B is low level, the current adjustment detection circuit generates the detection current IsB on the basis of the auxiliary detection current IrBP. More specifically, in the case that the selection signal V7B is high level, the selection circuit 7B sets the enable terminals of the adjustment circuits 4BP and 4BN to high level, thereby activating the adjustment circuits 4BP and 4BN, and sets the disenable terminal of the adjustment circuit 6B to high level, thereby deactivating the adjustment circuit 6B. In the case that the selection signal V7B is low level, the selection circuit 7B sets the enable terminals of the adjustment circuits 4BP and 4BN to low level, thereby deactivating the adjustment circuits 4BP and 4BN, and sets the disenable terminal of the adjustment circuit 6B to low level, thereby activating the adjustment circuit 6B. When the adjustment circuits 4BP, 6B and 4BN are deactivated, the auxiliary detection currents IqB, IrBP and IrBN corresponding thereto respectively are set to approximately zero. The reference voltage source 70B is set to the lower limit value in the range of the output voltage VtB at which the adjustment circuit 4BP can operate sufficiently.

The adjustment circuit 4BP is configured to pass the auxiliary detection current IqB in a direction of receiving the current from the terminal P3qB of the auxiliary switch circuit 3B. The adjustment circuit 4BN is configured to pass the auxiliary detection current IrBN in a direction of receiving the current from the terminal P5rB of the auxiliary switch circuit 5B. The adjustment circuit 6B is configured to pass the auxiliary detection current IrBP in a direction of outputting the current to the terminal P5rB of the auxiliary switch circuit 5B. In the case that the output current ItBP flows, the auxiliary detection currents IqB and IrBP flow in one direction, that is, from the positive power source potential VcB to the ground potential. On the other hand, in the case that the output current ItBN flows, the auxiliary detection current IrBN flows in one direction, that is, from the output potential VtB (i.e., the potential of the load 11B) to the ground potential. Furthermore, in the case that the output current ItBP flows, the potential of the terminal P1tB and the potential of the terminal P3qB, being approximately equal to one another, are lower than the potential of the terminal P1nB and the potential of the P3nB, being approximately equal to one another, by the ON voltage of the main switch circuit 1B. On the other hand, in the case that the output current ItBN flows, the potential of the terminal P1nB and the potential of the terminal P5rB, being approximately equal to one another, are lower than the potential of the terminal P1tB and the potential of the P5tB, being approximately equal to one another, by the ON voltage of the main switch circuit 1B. Hence, in the case that the output current ItBP flows, the potential of the adjustment circuit 4BP is present in the potential range from the potential of the terminal P1tB of the main switch circuit 1B to the ground potential (in other words, the potential range on the side of the ground potential). The potential range on the side of the ground potential is also referred to as the potential range on the side of the load potential since the potential of the load 11B is present therein. Furthermore, the potential of the adjustment circuit 6B is present in the potential range from the power source potential VcB to the potential of the terminal P1nB of the main switch circuit 1B (in other words, the potential range on the side of the power source potential VcB). On the other hand, in the case that the output current ItBN flows, the potential of the adjustment circuit 4BN is present in the potential range from the potential of the terminal P1nB of the main switch circuit 1B to the ground potential.

In a state in which the output potential VtB is sufficiently high, since the potential range on the side of the ground potential is sufficiently wide, the adjustment circuits 4BP and 4BN are activated, and the auxiliary detection currents IqB and IrBN are generated accurately, respectively. On the other hand, when the output potential VtB becomes low and the potential range on the side of ground potential becomes narrow, the adjustment circuit 4BP cannot securely obtain an operating voltage. Conversely, since the potential range on the side of the power source potential VcB becomes sufficiently wide, the adjustment circuit 6B can securely obtain a sufficient operating voltage. Hence, the adjustment circuit 6B is activated, and the auxiliary detection current IrBP is generated accurately. In the case that the output potential VtB is low, the output current ItBN does not flow. Hence, it is not necessary to use a circuit taking measures for insufficient operating voltage of the adjustment circuit 4BN.

As described above, the current detection circuit and the voltage converter using the current detection circuit according to the third embodiment are configured so that the potential range is separated, that is, the potential of each of the adjustment circuits 4BP and 4BN is present in the potential range on the side of the ground potential and the potential of the adjustment circuit 6B is present in the potential range on the side of the power source potential VcB. Hence, the auxiliary detection current can be generated accurately in either one of the ranges, and the output currents ItBP and ItBN can be detected accurately.

The main switch circuit 1B and the auxiliary switch circuits 3B and 5B may each be formed of a linearly operating device, such as a series regulator, or a switching device, such as a switching regulator. Furthermore, although the MOS transistors 41BP, 41BN and 61B are each formed of an NMOS transistor, the transistors may also each be formed of a PMOS transistor. In this case, the positive/negative polarities at the input terminals of the amplifiers 40BP and 40BN and the inverting amplifier 60 are required to be reversed to each other.

As described above, in the current detection circuit according to the present invention, the adjustment circuit (4; 6A; 4BP, 4BN) is configured to pass the auxiliary detection current (Iq; IrA; IqB, IrBN) in a direction of receiving the current from the auxiliary switch circuit (3; 5A; 3B, 5B), and the adjustment circuit (6; 4A; 6B) is configured to pass the auxiliary detection current (Ir; IqA; IrBP) in a direction of outputting the current to the auxiliary switch circuit (5; 3A; 5B). Each of the auxiliary detection current (Iq; IrA; IqB, IrBN) and the auxiliary detection current (Ir; IqA; IrBP) flows in one direction, that is, from the power source potential to the ground potential or from the ground potential to the power source potential. Furthermore, the potentials of the power source side terminals of the main switch circuit (1; 1A; 1B), the auxiliary switch circuits (3; 5A; 3B, 5B) and the auxiliary switch circuit (5; 3A; 5B) are approximately equal to one another, and the potentials of the ground side terminals of the main switch circuit are also approximately equal to one another. Hence, the respective potentials of the adjustment circuit (4; 6A; 4BP, 4BN) and the adjustment circuit (6; 4A; 6B) are separated between two sides of potentials different from each other, that is, the side of the power source potential and the side of the ground potential, while the potential across both terminals of the main switch circuit (1; 1A; 2B) is used as a boundary. Therefore, even in a state in which the voltage across the load lowers and the difference between the potential of the ground side terminal of the main switch circuit (1; 1A; 1B) and the ground potential lowers, either one of the adjustment circuit (4; 6A; 4BP, 4BN) and the adjustment circuit (6; 4A; 6B) can securely obtain a sufficient operating voltage. Consequently, it is possible to detect the output current (In; InA; InBP, InBN) accurately.

Examples all embodying the present invention are described in the above descriptions regarding the embodiments. However, the present invention is not limited to these examples but can be applied to various examples that can be configured easily by those skilled in the art using the technology according to the present invention.

What is claimed is:

1. A current detection circuit comprising:
    a main switch circuit capable of passing an output current received from a power source circuit to a load,
    a first auxiliary switch circuit connected to one terminal of said main switch circuit and a first terminal, and generating a first auxiliary detection current being smaller than said output current and approximately proportional to said output current when turned ON,
    a second auxiliary switch circuit connected to the other terminal of said main switch circuit and a second terminal, and generating a second auxiliary detection current being smaller than said output current and approximately proportional to said output current when turned ON, and
    a current adjustment detection circuit, wherein
    said current adjustment detection circuit includes a first adjustment circuit, a second adjustment circuit and a detection current generating circuit,
    said first adjustment circuit adjusts said first auxiliary detection current so that said other terminal and said first terminal have the same potential and passes said first auxiliary detection current in a direction of receiving said adjusted first auxiliary detection current from said first auxiliary switch circuit,
    said second adjustment circuit adjusts said second auxiliary detection current so that said one terminal and said second terminal have the same potential and passes said adjusted second auxiliary detection current in a direction of outputting said second auxiliary detection current to said adjusted second auxiliary switch circuit, and
    said detection current generating circuit generates a detection current being smaller than said output current and approximately proportional to said output current on the basis of said adjusted first detection current and said adjusted second detection current.

2. The current detection circuit according to claim 1, further comprising a selection circuit operable to generate a selection signal representing a first level in the case that the voltage at the load side terminal of said main switch circuit is equal to or more than a predetermined voltage and to generate a selection signal representing a second level in the case that the voltage at said terminal is less than the predetermined voltage, wherein said current adjustment detection circuit generates said detection current on the basis of said first auxiliary detection current in the case that the level of said selection signal is said first level and generates said detection current on the basis of said second auxiliary detection current in the case that the level of said selection signal is said second level.

3. The current detection circuit according to claim 2, wherein said selection circuit deactivates said second adjustment circuit in the case that the level of said selection signal is said first level and deactivates said first adjustment circuit in the case that the level of said selection signal is said second level.

4. The current detection circuit according to claim 3, wherein
    said first adjustment circuit sets said first auxiliary detection current to approximately zero when deactivated and
    said second adjustment circuit sets said second auxiliary detection current to approximately zero when deactivated.

5. The current detection circuit according to claim 1, wherein said detection current generating circuit generates said detection current representing the sum of said first auxiliary detection current and said second auxiliary detection current.

6. The current detection circuit according to claim 1, wherein
    said detection current generating circuit
    includes a current mirror circuit operable to generate a current mirror current being approximately equal to either one of said first auxiliary detection current, said second auxiliary detection current and the sum of said first auxiliary detection current and said second auxiliary detection current, and
    generates said detection current on the basis of said current mirror current.

7. The current detection circuit according to claim 1, wherein the semiconductor structures of said first auxiliary switch circuit and said second auxiliary switch circuit are approximately equivalent to that of said main switch circuit, and the semiconductor sizes of said auxiliary switch circuits are smaller than that of said main switch circuit.

8. The current detection circuit according to claim 1, wherein the ON resistances of said first auxiliary switch circuit and said second auxiliary switch circuit are smaller than that of said main switch circuit.

9. The current detection circuit according to claim 1, wherein said first auxiliary switch circuit and said second auxiliary switch circuit are turned ON in the case that said main switch circuit is turned ON.

10. The current detection circuit according to claim 9, wherein each of the control terminals of said first auxiliary switch circuit and said second auxiliary switch circuit receives a voltage approximately equal to the voltage at the control terminal of said main switch circuit.

11. The current detection circuit according to claim 1, wherein said main switch circuit can pass said output current between said power source circuit and a capacitor.

12. The current detection circuit according to claim 1, wherein said first auxiliary switch circuit and said second auxiliary switch circuit each include at least one MOS transistor.

13. The current detection circuit according to claim 12, wherein said first auxiliary switch circuit and said second auxiliary switch circuit each include an N-channel MOS transistor and a P-channel MOS transistor.

14. The current detection circuit according to claim 1, wherein
said first adjustment circuit includes an amplifier and an adjuster,
said amplifier generates an amplified signal linearly changing with respect to the difference between the potential of said other terminal and the potential of said first terminal, and
said adjuster is controlled by said amplified signal and adjusts said first auxiliary detection current so that the difference between said two potentials is approximately zero.

15. The current detection circuit according to claim 1, wherein
said second adjustment circuit includes an amplifier and an adjuster,
said amplifier generates an amplified signal linearly changing with respect to the difference between the potential of said one terminal and the potential of said second terminal, and
said adjuster is controlled by said amplified signal and adjusts said second auxiliary detection current so that the difference between said two potentials is approximately zero.

16. The current detection circuit according to claim 1, wherein
said first auxiliary switch circuit is connected to the power source circuit side terminal of said main switch circuit, and
said second auxiliary switch circuit is connected to the load side terminal of said main switch circuit.

17. The current detection circuit according to claim 1, wherein
said first auxiliary switch circuit is connected to the load side terminal of said main switch circuit, and
said second auxiliary switch circuit is connected to the power source circuit side terminal of said main switch circuit.

18. The current detection circuit according to claim 1, wherein
said first auxiliary switch circuit is connected to the power source circuit side terminal of said main switch circuit, and
said second auxiliary switch circuit is connected to the load side terminal of said main switch circuit.

19. The current detection circuit according to claim 1, wherein
said first auxiliary switch circuit is connected to the load side terminal of said main switch circuit.

20. The current detection circuit according to claim 1, wherein said power source circuit includes:
a voltage conversion circuit capable of raising or lowering a DC power source voltage supplied from a DC power source and capable of generating an output current.

21. The current detection circuit according to claim 20, wherein
said voltage conversion circuit includes an inductor, a first transistor and a second transistor,
said first transistor is connected to said DC power source and one terminal of said inductor and is used to lower the voltage of said DC power source by performing switching, and
said second transistor is connected to the other terminal of said inductor and a ground terminal and is used to raise the voltage of said DC power source by charging and discharging said inductor by performing switching.

22. The current detection circuit according to claim 21, wherein
said first transistor is a P-channel MOS transistor, and said second transistor is an N-channel MOS transistor.

* * * * *